United States Patent
Ash et al.

(10) Patent No.: US 6,590,693 B2
(45) Date of Patent: Jul. 8, 2003

(54) LIGHT MODULATION

(75) Inventors: Richard Mark Ash, Bury St Edmunds (GB); Christopher Anthony Park, Bacton (GB); Andrew Thomas Harker, Ipswich (GB)

(73) Assignee: Agilent Technologies, Inc., Palo Alto, CA (US)

( * ) Notice: Subject to any disclaimer, the term of this patent is extended or adjusted under 35 U.S.C. 154(b) by 50 days.

(21) Appl. No.: 09/861,981

(22) Filed: May 16, 2001

(65) Prior Publication Data

US 2002/0075549 A1 Jun. 20, 2002

(30) Foreign Application Priority Data

Dec. 20, 2000 (EP) ............................................. 00311499

(51) Int. Cl.[7] .............................. G02F 1/03; G02F 1/01; H01S 3/04
(52) U.S. Cl. .......................... 359/249; 359/276; 372/34
(58) Field of Search ................................ 359/181, 187, 359/249, 276; 372/34

(56) References Cited

U.S. PATENT DOCUMENTS 5,629,792 A   5/1997   Masaki ....................... 359/245

FOREIGN PATENT DOCUMENTS

| DE | 197 46 204 | 4/1999 |
|---|---|---|
| EP | 1 017 141 | 7/2000 |
| JP | 03073915 | 3/1991 |
| JP | 07106691 | 4/1995 |
| JP | 09043626 | 2/1997 |
| JP | 11298088 | 10/1999 |
| WO | WO 00/01046 | 1/2000 |

OTHER PUBLICATIONS

Claessen, L. European Search Report, Application Number EP 00 31 1499, dated Jul. 12, 2001.

*Primary Examiner*—Georgia Epps
*Assistant Examiner*—David N. Spector

(57) ABSTRACT

The present invention relates to a modulated light source, in particular for use as part of an opto-electronic communication network. The modulated light source has a laser and an external electro-optic modulator for modulating the intensity of light produced by the laser. A temperature sensor senses the temperature of the laser and the modulator. A control circuit connected to the temperature sensor adjusts the bias on the modulator so that the band edge of the modulator follows the changes in wavelength of the laser as the laser warms up during operation. This avoids the need for a cooling element to keep the temperature of the laser constant.

17 Claims, 3 Drawing Sheets

LIGHT MODULATION

BACKGROUND OF THE INVENTION

1. Field of the Invention

The present invention relates to a modulated light source, in particular for use as part of an opto-electronic communication network.

2. Description of the Related Art

In an opto-electronic communications network, it can be desirable to produce a high frequency modulated light source. One way of achieving this is to pass light of initially constant intensity through a modulator. Normally the modulator is formed from a modulator material whose optical properties depend on the electric field applied across it, so that modulating the electric field across the modulator material results in a modulation in the intensity of light passing through it. Examples of modulators used to modulate light from a laser outside the lasing medium include electro-absorption modulators, Mach-Zender interferometer modulators, and Fabry-Perot modulators.

The modulator material is normally biased with a quiescent voltage in order to bring it into an operating mode where an absorption edge of the modulator material is close to the wavelength of the light being modulated. A modulation voltage is superposed to the quiescent voltage in order to modulate the intensity of light passing through the modulator material, the quiescent voltage normally being constant in time or slowly varying as compared to the modulation voltage (typically, the quiescent voltage will vary with a frequency of less than 10 kHz, whereas the frequency of the modulation voltage will normally be between about 1 GHz and 100 GHz).

However, the absorption edge and other characteristics of the modulator material can vary if the temperature of the modulator changes, with the result that the modulator is no longer as effective. It is known therefore to mount the modulator on a temperature control element in order to keep the temperature of the modulator stable but this can be expensive.

SUMMARY OF THE INVENTION

It is an object of the present invention to address the above issues.

According to a first aspect of the present invention, there is provided a modulated light source comprising a laser and a modulator assembly for modulating the intensity of light produced by the laser, wherein the modulator assembly has: a modulator element with a modulating medium for modulating the intensity of light passing therethrough; electrodes for applying an electric field across the modulating medium; a temperature sensor for sensing the temperature of the modulating medium and for producing a temperature signal indicative of the temperature thereof; and, an electronic compensation circuit having an input for receiving the temperature signal from the temperature sensor, an output connected to the electrodes of the modulating medium for applying a quiescent voltage thereto, and a control unit for controlling the quiescent voltage according to a predetermined functional relationship with the received temperature signal.

The predetermined functional relationship between the temperature signal and the quiescent voltage can be chosen to suit the modulating medium employed, so that that if the modulating medium and/or the laser changes temperature during use, the applied quiescent voltage changes also, in such a way as to keep the modulator operating effectively. This reduces the need for a cooling element to keep the temperature of the modulator and/or the laser constant.

The control unit will preferably have a memory with a look up table, the look up table having data representative of a plurality of temperature signal values and data representative of a plurality of quiescent voltage values, wherein each temperature signal value is associated with a quiescent voltage value, and wherein the quiescent voltage value for each temperature signal value is chosen according to the predetermined relationship. This will allow the control unit to easily produce the correct quiescent voltage for each received temperature signal.

The control unit may also have a processor with a feed back algorithm programmed therein, such that if the quiescent voltage applied to the modulating medium is not equal to a target quiescent voltage, a change in the quiescent voltage is made, the change being a function of the difference between the applied quiescent voltage and the target quiescent voltage.

If the predetermined relationship between the quiescent voltage and the temperature signal is sufficiently simple, the control unit may comprise a transistor circuit having an output for outputting an output signal, an input for inputting an input signal and one or more transistors, the transistors being connected such that relationship between the input signal and the output signal is representative if the predetermined relationship between the quiescent voltage and the temperature signal. Such a transistor circuit will be particularly useful since it will reduce the need for a look up table if the predetermined relationship between the quiescent voltage and the temperature signal is linear or quasi linear.

The modulating medium will preferably have an absorption edge, the wavelength at which the absorption edge occurs being dependent on the electric field applied across the modulating medium. The quiescent voltage can then be set such that the wavelength at which the absorption edge occurs is close to the wavelength of the light produced by the laser (typically between about 1300 nm and 1550 nm), with the result that a small modulating voltage superposed on the quiescent voltage will cause a significant modulation in the amount of light that is able to pass through the modulator element.

If the wavelength of light produced by the laser remains constant, the predetermined functional relationship between the temperature signal and the quiescent voltage can be chosen to keep the absorption edge at the same wavelength when the temperature of the modulator changes.

However, in many situations the laser will self heat during use or its temperature will change as a consequence of ambient temperature variations, with the result that the wavelength it produces will change. Therefore the modulator element will preferably be in thermal contact with the laser so that the temperature of the laser can be inferred from the temperature of the modulator element. The predetermined functional relationship between the quiescent voltage and the temperature signal will then be chosen such that the absorption edge of the modulating medium follows the changes in the wavelength of light produced by the laser.

The modulating medium will preferably be formed from a semiconductor material. The semiconductor material may be a bulk material, in which case the absorption edge will be the band edge of the bulk material, the wavelength of the band edge being electric field dependent according to the Franz-Keldysch effect.

The modulating medium may be formed from a plurality of layers, such as a multiple quantum well structure, and the field dependence of the absorption edge may be due to the Quantum Confined Stark Effect. The laser may also be formed from a plurality of different semiconductor layers.

The different layers of semiconductor in the modulating medium and/or the laser will preferably be formed from combinations of In, Ga, As, Al, Sb or P in different proportions.

In order to facilitate fabrication, the laser and the modulator element may be formed on a common substrate as a monolithic device.

The modulator element will preferably have an input facet and an output facet through which light respectively enters and leaves the modulator element, and the laser will preferably have at least one light emitting facet through which light is emitted, the laser and the modulator element being arranged such that that the light emitting facet of the laser faces the input facet of the modulating element. This will make it easier for light produced by the laser to enter the modulator element.

The light emitting facet of the laser may be coincident or in contact with the input facet of the modulator element, such that the laser and the modulator are butt coupled Alternatively, a waveguide and/or a lens may be provided between the laser and the modulator element in order to reduce the amount of light that is lost between the laser and the modulator element. A mode converting element may be provided between the laser and the modulator to increase the amount of light from the laser entering the modulator.

An optical isolating element may be provided at the output of the modulator to reduce the amount of light reflected back into the modulator. Alternatively, the optical isolating element may be provided between the modulator and the laser.

The laser may be a distributed Bragg reflector laser or a distributed feedback laser. To stabilise the wavelength of emitted light, the laser may have an external Bragg grating. The external Bragg grating may be an formed from an optic fibre or a waveguide. The waveguide may be fabricated substantially from any one or more of the following: a polymer material, silicon, silicon nitride, or silicon oxide.

The laser and the modulator element will preferably be placed on a common chip carrier, so as to form a single packaged unit. The packaged unit may be fabricated using conventional techniques such as soldering, adhesive bonding, laser welding and thermo-compression bonding.

The temperature sensor may be placed on the chip carrier, in thermal contact with both the laser and the modulator element. Alternatively, the temperature sensor may be formed integrally with the laser or the modulator element. If the laser and the modulator element are formed as a monolithic device, the temperature sensor may be formed integrally therewith, in order to reduced the temperature gradient between the monolithic device and the sensor.

To provide a more accurate temperature reading or if the laser and the modulator are thermally isolated, the modulated light source may comprise two temperature sensors, one sensor for sensing the temperature of the laser, and the other sensor for sensing the temperature of the modulator element.

The or each sensor may be a thin film sensor such as a platinum resistance thermometer, or a semiconductor sensor, the semiconductor sensor being for example a p-n junction or a thermistor.

In one embodiment, the laser will be placed on a first chip carrier and the modulator element will be placed on a second chip carrier, a light guide or optical fibre being provided between the first and second chip carrier to feed light from the laser to the input facet of the modulator element. This will allow the modulator assembly to be used with different lasers, allowing more flexibility. A laser temperature sensor producing a laser temperature signal will preferably be provided on the first chip carrier to measure the temperature of the laser.

The first and second chip carriers may be placed adjacent to one another, or on different positions on a circuit board. Alternatively, the first and second chip carrier may be separated by a distance of several meters or several kilometers if an optic fibre is used to couple the first and second chip carriers.

A modulating circuit associated with the laser may be provided for modulating the laser light output with a digital code representative of the laser temperature. A detector connected to the compensation circuit may be provided with the modulator assembly to detect the light from the laser and read the digital code representative of the laser temperature, so that the compensation circuit can take into account the laser temperature when setting the quiescent voltage on the modulator element.

According to a second aspect of the present invention, there is provided a light modulator assembly for modulating light intensity comprising: a modulating medium for modulating the intensity of light passing therethrough; electrodes for applying an electric field across the modulating medium; a temperature sensor for sensing the temperature of the modulating medium and for producing a temperature signal indicative of the temperature thereof; and, an electronic compensation circuit having an input for receiving the temperature signal from the temperature sensor, an output connected to the electrodes of the modulating medium for applying a quiescent voltage thereto, and a control unit for controlling the quiescent voltage according to a predetermined functional relationship with the received temperature signal.

BRIEF DESCRIPTION OF THE DRAWINGS

The invention will now be further described by way of example with reference to the accompanying drawings in which.

DESCRIPTION OF THE INVENTION

Figure 1:
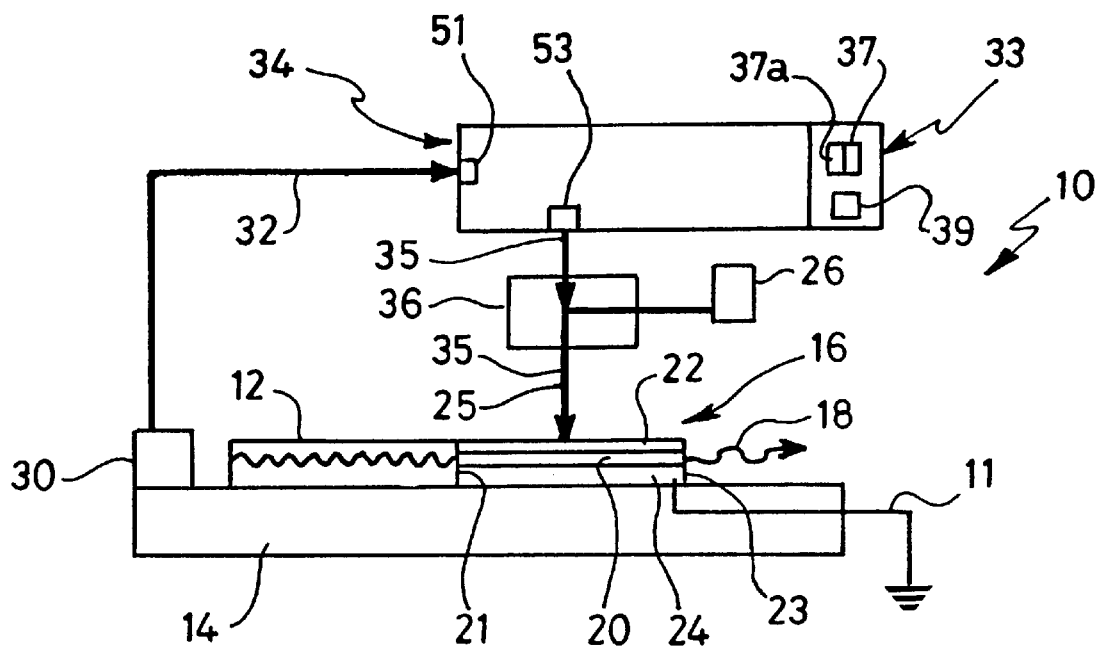
FIG. 1 shows a laser arrangement with a modulator according to a first embodiment of the present invention.

In FIG. 1, there is shown a laser arrangement 10 in which a distributed feedback laser 12 is mounted on a substrate 14. A modulator 16 having a modulating medium 20 is mounted on the substrate 14 next to the laser 12. The modulating medium 20 has an entrance facet 21 and an exit facet 23 arranged such that light 18 generated by the laser 12 enters the modulating medium through the entrance facet 21 and leaves the modulating medium 20 through the exit facet 23, the intensity of the light 18 being modulated as it passes through the modulating medium 20.

The modulating medium 20 is located between an upper electrode 22 and a lower electrode 24, so that when a potential difference is applied between the upper electrode 22 and the lower electrode 24, an electric field results across the modulating medium 20. The electric field across the modulating medium 20 changes its optical properties and hence the amount of light that is able to passes through it, with the result that the intensity of light leaving the modulator 16 is controlled by the applied potential difference between the upper electrode 22 and the lower electrode 24. (It will be appreciated that the terms upper electrode and lower electrode are used with respect to the orientation of the laser arrangement in the drawings).

Figure 2:
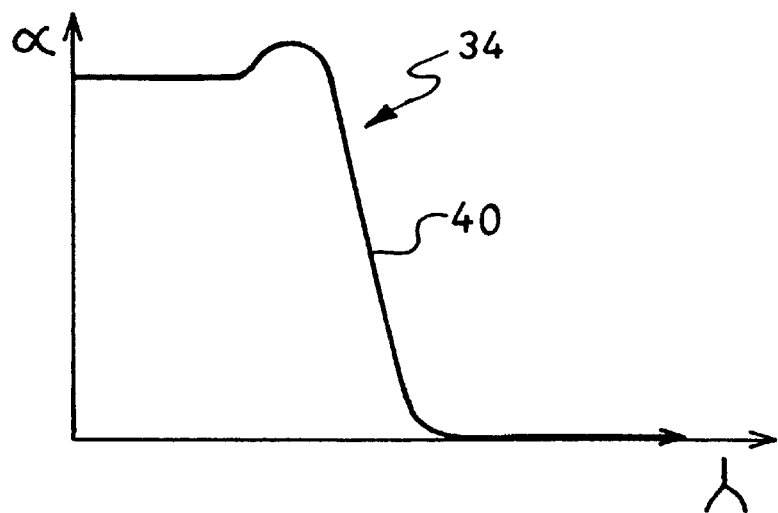
FIG. 2 shows schematically the absorption of a typical modulator material as a function of wavelength.

FIG. 2 shows a trace 34 illustrating the absorption ($\alpha$) of the modulating medium as a function of wavelength ($\lambda$) when a dc (quiescent) signal is applied to the upper electrode 22 of the modulator 16. The trace 34 has a band edge region 40 where the absorption changes strongly with wavelength, decreasing by about 90% over a wavelength range of about 20 nm. The wavelength at which the band edge occurs depends on both the applied dc signal 35 and temperature, the band edge 40 moving to longer wavelength with increasing dc signal and/or temperature. In operation the dc signal is chosen such that the wavelength of the band edge is close to the wavelength of the light produced by the laser 12 so that a small modulating electric field across the modulating medium produces a large change in absorption.

In order to apply a modulating electric field across the modulating medium 20, the lower electrode 24 is connected to ground by a ground connection 11, and a modulation potential 25 is applied to the upper electrode 22 by a signal generator 26. However, it will be appreciated that the lower electrode 24 need not be connected to ground, and that for example the upper electrode 22 may be negative and the lower electrode 24 may be positive.

A temperature sensor 30 producing a temperature signal 32 is mounted on the substrate 14, the temperature sensor 30 being in thermal contact with the modulator 16 so that the temperature signal 32 is representative of the temperature of the modulator 16. Because the modulator 16 is in thermal contact with the laser 12, the temperature of the laser 12 can be deduced from the temperature of the modulator 16. For each value of temperature sensed by the temperature sensor 30, the value of dc signal required to keep the band edge 40 of the modulator 16 at the lasing wavelength of the laser can be determined, either experimentally or theoretically, and stored in the form of calibration data.

A compensation circuit 34 receives the temperature signal 32 at an input 51 and outputs a dc signal 35 at an output 53, the dc signal being applied to the upper electrode 22, in superposition with the modulation potential 25. A tee circuit 36 is used to superpose the dc signal 35 and the modulation potential 25 together.

The compensation circuit 34 has a control unit 33 with a memory 37 for storing the calibration data, the calibration data comprising a plurality of dc signal values and a plurality of temperature values wherein a dc signal value is associated with each temperature value. The control unit has a processor 39 for selecting the dc signal value associated with the temperature value corresponding to the temperature signal 32 produced by the temperature sensor 30. Thus at each temperature, the dc signal 35 applied to the modulating medium 20 will keep the band edge 40 of the modulating medium 20 close to the wavelength of light produced by the laser 12.

Figure 3:
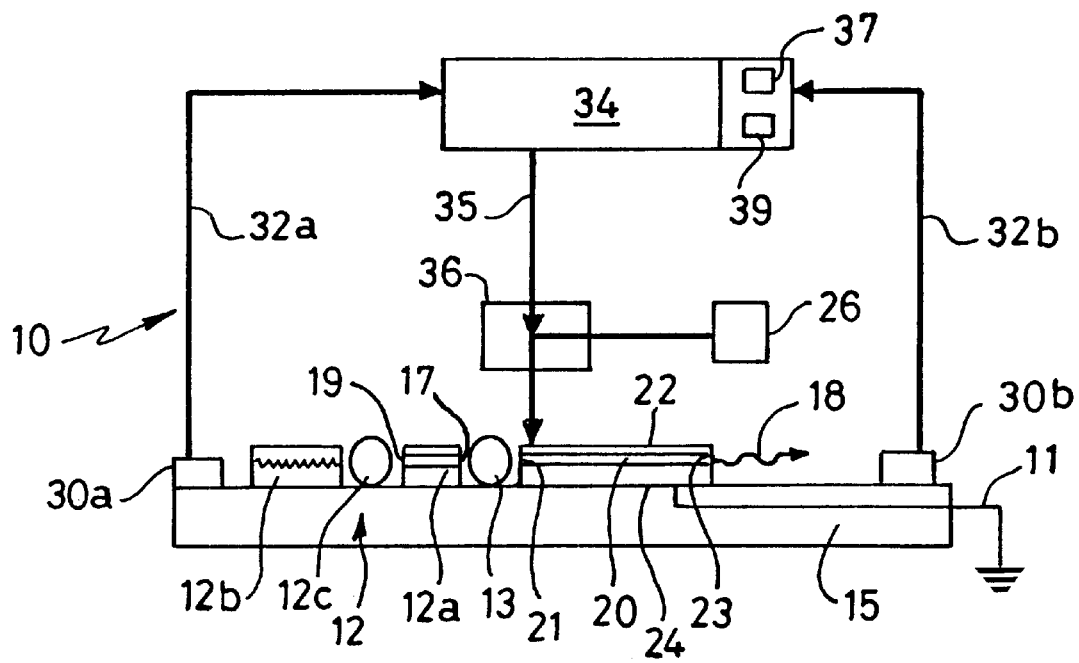
FIG. 3 shows a laser arrangement with a modulator in a second embodiment of the invention.

A second embodiment of a laser arrangement 10 is shown in FIG. 3. In this embodiment the laser 12 and the modulator 16 are separate components, each being independently secured to a chip carrier 15 having good thermal conductivity. The laser 12 has a laser diode 12a for generating light, an external Bragg grating 12b for stabilising the wavelength of light generated by the laser diode 12a, and a lens 12c to couple light between the Bragg grating 12b and the laser diode 12a. Light incident from a back facet 19 of the laser diode 12a is reflected back into the diode 12 by the Bragg grating, through the lens 12c. Light incident from a front facet 19 of laser diode 12a is coupled into the modulator 16 by a coupling lens 13.

Because there may be a significant thermal gradient between the modulator 16 and the external Bragg grating 12b, a first temperature sensor 30a is provided for sensing the temperature of the external Bragg grating 12b, and a second temperature sensor 20b is provided for sensing the temperature of the modulator 16. The first and second temperature sensors 30a,30b each produce a temperature signal 32a,32b indicative of the temperature of the Bragg grating 12b and the modulator 16 respectively. Each sensor 32a,32b is connected to the compensation circuit 34, the compensation circuit 34 having a memory with calibration data allowing the correct value of dc signal to be applied according to the temperature signals produced by the first temperature sensor 30a and the second temperature sensor 30b.

Figure 4:
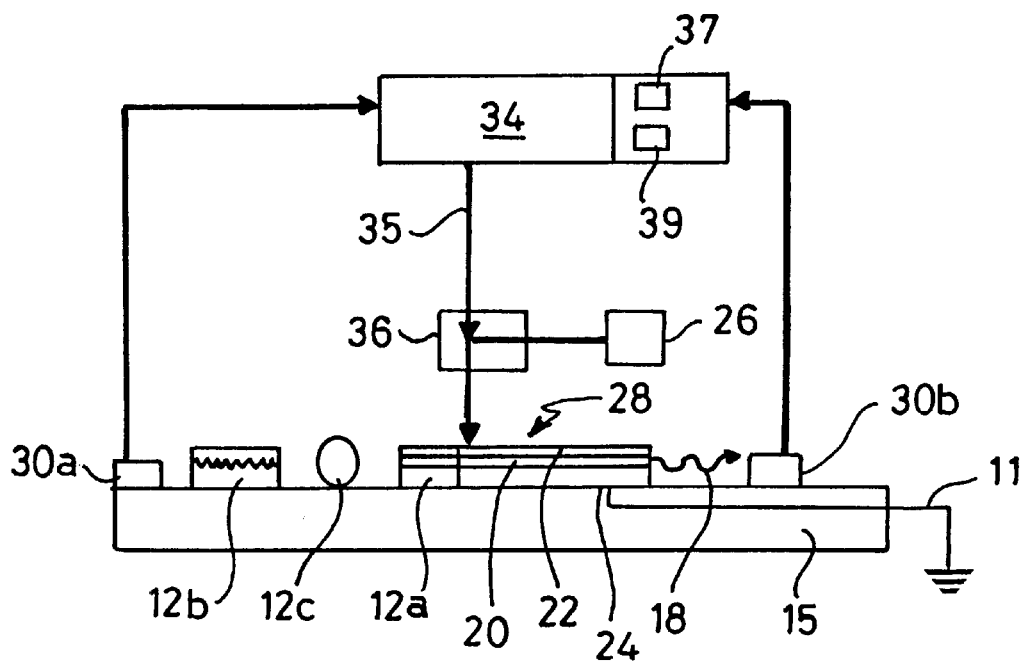
FIG. 4 shows a laser arrangement with a modulator in a third embodiment of the invention; and, FIG. 5 shows a laser arrangement with a separate modulator in a fourth embodiment of the invention.

A third embodiment is shown in FIG. 4. In this embodiment the laser diode 12a is integrally formed with the modulator 16 as a monolithic device 28. As with the second embodiment, a first temperature sensor 30a is provided for sensing the temperature of the Bragg grating 12b, and a second temperature sensor 30b is provided for sensing the temperature of the modulator 16. The provision of two sensors 30a,30b is important if the thermal conductance between the external Bragg grating and the monolithic circuit 28 is poor, since the external Bragg grating 12b largely determines the wavelength of light produced by the laser diode 12a.

Figure 5:
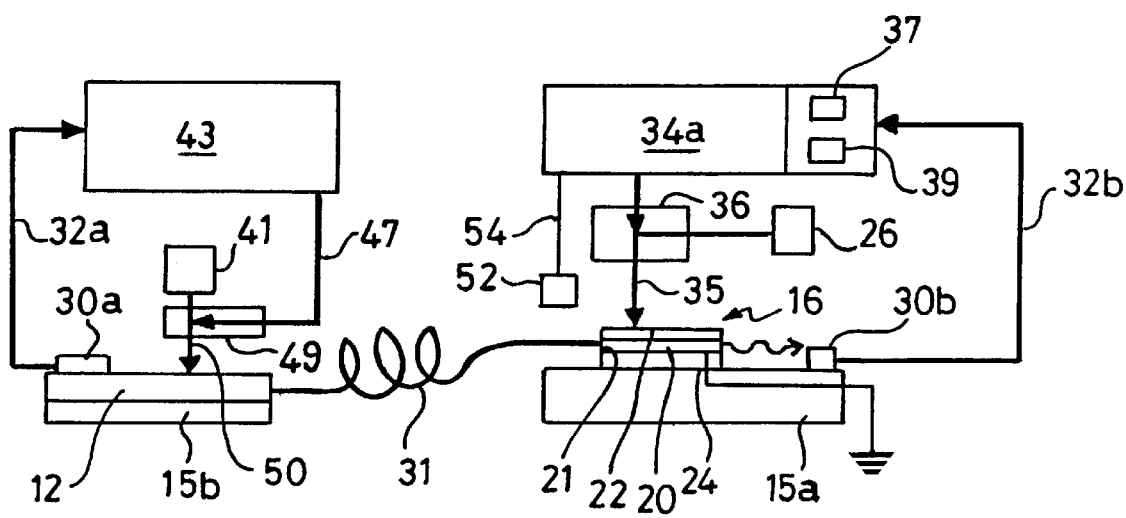

FIG. 5 shows yet another embodiment, where the modulator 16 is mounted on a first chip carrier 15a and the laser 12 is mounted on a second chip carrier 15b, the light from the laser 12 being fed to the modulator 16 by an optic fibre 31. The first chip carrier 15a has a modulator sensor 30b in thermal contact with the modulator 16, the sensor 30b being connected to a first compensation circuit 34a for applying a dc signal to the modulating medium 20.

Because the modulator 16 is not in thermal contact with the laser 12 on the second chip carrier 15b, a laser sensor 30a is provided on the second chip carrier 30b to sense the temperature of the laser 12. The sensor 30a produces a first temperature signal 32a which is fed to a an encoder 43 for producing a digital coded signal 47 representative of the temperature signal 32a. The coded signal 47 is superposed by an adder circuit 49 to a power supply signal 50 (produced by a power supply 41) for driving the laser 12, so that the laser output light is modulated with a modulation representative of the digital coded signal 47.

A light detector 52 connected to the compensation circuit 34a for the modulator 16 detects the digital coded signal 47 and sends to the compensation circuit 34a a second laser temperature signal 54 representative of the laser temperature, so that the compensation circuit 34a can take into account the temperature of the laser 12 when setting the dc signal 35 on the modulator 16.

As it will be appreciated from the above description, the above invention provides a simple way of modulating light from a laser at high frequency with an external modulator, whilst allowing the laser wavelength to change as the laser warms up, even when the wavelength at which the laser and the modulator operate changes at different rates with temperature.

What is claimed is:

1. A modulated light source comprising a laser and a modulator assembly for modulating the intensity of light produced by the laser, wherein the modulator assembly has: a modulator element with a modulating medium for modulating the intensity of light passing therethrough; electrodes for applying an electric field across the modulating medium; a temperature sensor for sensing the temperature of the modulating medium and for producing a temperature signal indicative of the temperature thereof; and, an electronic compensation circuit arranged to adjust a bias on the modulating medium so that a band edge of the modulating medium follows changes in the wavelength of the laser, the circuit having an input for receiving the temperature signal from the temperature sensor, an output connected to the electrodes of the modulating medium for applying a quiescent voltage thereto, and a control unit for controlling the quiescent voltage according to a predetermined functional relationship with the received temperature signal.

2. A modulated light source as claimed in claim 1, wherein the control unit has a memory with a look up table, the look up table having data representative of a plurality of temperature signal values and data representative of a plurality of quiescent voltage values, wherein each temperature signal value is associated with a quiescent voltage value, and wherein the quiescent voltage value for each temperature signal value is chosen according to the predetermined relationship.

3. A modulated light source as claimed in claim 1, wherein the modulating medium has an absorption edge, the wavelength at which the absorption edge occurs being dependent on the electric field applied across the modulating medium.

4. A modulated light source as claimed in claim 1, wherein the modulator element is in thermal contact with the laser.

5. A modulated light source as claimed in claim 4, wherein the laser and the modulator element are formed on a common substrate as a monolithic device.

6. A modulated light source as claimed in claim 4, wherein the laser and the modulator element are secured to a common chip carrier.

7. A modulated light source as claimed in claim 6, wherein a lens is provided between the laser and the modulator element.

8. A modulated light source as claimed in claim 1, wherein the laser has an external Bragg grating.

9. A modulated light source as claimed in claim 6, wherein the temperature sensor is placed on the chip carrier.

10. A modulated light source as claimed in claim 6, wherein the temperature sensor is formed integrally with the laser or the modulator element.

11. A modulated light source as claimed in claim 1, wherein modulated light source comprises two temperature sensors, one sensor for sensing the temperature of the laser, and the other sensor for sensing the temperature of the modulator element.

12. A modulated light source as claimed in claim 1, wherein the laser is placed on a first chip carrier and the modulator element is placed on a second chip carrier, a light guide or optical fibre being provided between the first and second chip carrier to feed light from the laser to the input facet of the modulator element.

13. A modulated light source as claimed in claim 12, wherein a modulating circuit associated with the laser is provided for modulating the laser light output with a digital code representative of the laser temperature, and wherein a detector connected to the compensation circuit is provided with the modulator assembly to detect the light from the laser and read the digital code representative of the laser temperature, such that the compensation circuit can take into account the laser temperature when setting the quiescent voltage on the modulator element.

14. A modulated light source as claimed in claim 1, wherein the laser and/or the modulating medium is formed from a semiconductor material.

15. A modulated light source as claimed in claim 14, wherein the modulating medium is formed from a plurality of layers.

16. A modulated light source as claimed in claim 15, wherein the laser and/or the modulating medium is formed from different layers having two of more of the following elements in different proportions: In, Ga, As, Al, Sb, or P.

17. A light modulator assembly for modulating light intensity comprising: a modulating medium for modulating the intensity of light passing therethrough; electrodes for applying an electric field across the modulating medium; a temperature sensor for sensing the temperature of the modulating medium and for producing a temperature signal indicative of the temperature thereof and, an electronic compensation circuit arranged to adjust a bias on the modulating medium so that a band edge of the modulating medium follows changes in the wavelength of the light, the circuit having an input for receiving the temperature signal from the temperature sensor, an output connected to the electrodes of the modulating medium for applying a quiescent voltage thereto, and a control unit for controlling the quiescent voltage according to a predetermined functional relationship with the received temperature signal.

* * * * *